(12) United States Patent
Ha et al.

(10) Patent No.: US 8,564,195 B2
(45) Date of Patent: Oct. 22, 2013

(54) DISPLAY DEVICE

(75) Inventors: Jae-kook Ha, Yongin-si (KR); Kyu-ha Chung, Seoul (KR); Chang-woong Chu, Suwon-si (KR); Joo-hyeon Lee, Yongin-si (KR)

(73) Assignee: Samsung Display Co., Ltd. (KR)

( * ) Notice: Subject to any disclaimer, the term of this patent is extended or adjusted under 35 U.S.C. 154(b) by 864 days.

(21) Appl. No.: 12/012,949

(22) Filed: Feb. 5, 2008

(65) Prior Publication Data

US 2008/0191621 A1 Aug. 14, 2008

(30) Foreign Application Priority Data

Feb. 9, 2007 (KR) ........................ 10-2007-0013868

(51) Int. Cl.
*H01L 51/50* (2006.01)

(52) U.S. Cl.
USPC ......................................... 313/506; 313/504

(58) Field of Classification Search
USPC ....................................................... 313/506
See application file for complete search history.

(56) References Cited

U.S. PATENT DOCUMENTS

| | | | |
|---|---|---|---|
| 2002/0086180 A1 | 7/2002 | Seo et al. | |
| 2002/0113546 A1 | 8/2002 | Seo et al. | |
| 2002/0121860 A1* | 9/2002 | Seo et al. ...................... | 313/506 |
| 2003/0170491 A1* | 9/2003 | Liao et al. ...................... | 428/690 |
| 2004/0227460 A1* | 11/2004 | Liao et al. ...................... | 313/506 |
| 2005/0112404 A1 | 5/2005 | Hamada et al. | |
| 2005/0258433 A1 | 11/2005 | Djurovich et al. | |
| 2006/0066231 A1 | 3/2006 | Nishikawa et al. | |
| 2006/0088729 A1 | 4/2006 | Begley et al. | |
| 2006/0243967 A1 | 11/2006 | Nomura et al. | |
| 2007/0099026 A1* | 5/2007 | Lee et al. ...................... | 428/690 |
| 2008/0102310 A1* | 5/2008 | Thompson et al. ........... | 428/690 |

FOREIGN PATENT DOCUMENTS

| | | |
|---|---|---|
| CN | 1366354 | 8/2002 |
| CN | 1370034 | 9/2002 |
| CN | 1753592 | 3/2006 |
| EP | 1220339 A2 | 7/2002 |
| JP | 2000-340361 A | 12/2000 |
| JP | 2004-6165 | 1/2004 |
| JP | 2005-116203 | 4/2005 |
| JP | 2006-108190 | 4/2006 |
| JP | 2006-332633 | 12/2006 |
| JP | 2007027092 A * | 2/2007 |
| KR | 10-2002-0055418 A | 7/2002 |
| KR | 10-2003-0069097 A | 8/2003 |
| KR | 2005-0024763 | 3/2005 |
| WO | WO 2007071451 A1 * | 6/2007 |

OTHER PUBLICATIONS

European Search Report for corresponding to EP Application No. 08001462, Nov. 21, 2011, 10 pages.
English Language Abstract, Publication No. JP2004006165, Jan. 8, 2004, 1 p.

(Continued)

*Primary Examiner* — Britt D Hanley
(74) *Attorney, Agent, or Firm* — Innovation Counsel LLP

(57) ABSTRACT

A display device includes: a first electrode; a second electrode; and an emitting material layer which is interposed between the first electrode and the second electrode, the emitting material layer being doped with an electric charge transport material of which content varies along a thickness direction and comprising a plurality of sub-layers staked in sequence.

10 Claims, 16 Drawing Sheets

(56) References Cited

OTHER PUBLICATIONS

English Language Abstract, Publication No. JP2005116203, Apr. 28, 2005, 1 p.

English Language Abstract, Publication No. JP2006108190, Apr. 20, 2006, 1 p.

Korean Patent Abstracts, Publication No. 1020050024763, Mar. 11, 2005, 1 p.

* cited by examiner

DISPLAY DEVICE

CROSS-REFERENCE TO RELATED APPLICATIONS

This application claims priority from Korean Patent Application No. 10-2007-0013868, filed on Feb. 9, 2007 in the Korean Intellectual Property Office, the disclosure of which is incorporated herein by reference.

BACKGROUND OF INVENTION

1. Field of Invention

Apparatuses consistent with the present invention relate to a display device.

2. Description of the Related Art

Recently, among flat panel display devices, an organic light emitting diode has been in the limelight owing to a low voltage driving, a light-weight and thinness, a wide viewing angle, and a fast response.

The organic light emitting diode includes an emitting material layer which emits light. The emitting material layer receives and recombines electrons and holes, thereby emitting light.

However, if the electrons and the holes are not balanced in the emitting material layer, electric charge availability decreases.

Particularly, in the case where a plurality of sub-layers are used for the emitting material layer, it is more difficult to balance the electrons and the holes with regard to each sub-layer.

SUMMARY OF THE INVENTION

Accordingly, it is an aspect of the present invention to provide a display device with excellent electric charge availability.

Additional aspects of the present invention will be set forth in part in the description which follows and, in part, will be obvious from the description, or may be learned by practice of the present invention.

The foregoing and/or other aspects of the present invention can be achieved by providing a display device including: a first electrode; a second electrode; and an emitting material layer which is interposed between the first electrode and the second electrode, the emitting material layer being doped with an electric charge transport material of which content varies along a thickness direction and including a plurality of sub-layers stacked in sequence.

According to an aspect of the invention, at least one of the sub-layers includes: a pair of first regions doped with the electric charge transport material by a first content; and a second region doped with the electric charge transport material by a second content lower than the first content, and placed between the pair of first regions.

According to an aspect of the invention, the second region is thicker than a thickness sum of the pair of first regions.

According to an aspect of the invention, at least one of the first regions contacts another one of the sub-layers.

According to an aspect of the invention, at least one of the sub-layers includes: a first region doped with the electric charge transport material by a first content; and a second region doped with the electric charge transport material by a second content lower than the first content.

According to an aspect of the invention, the second region is thicker than the first region.

According to an aspect of the invention, the first region contacts another one of different sub-layers.

According to an aspect of the invention, the second region is placed in an outmost part of the emitting material layer.

According to an aspect of the invention, the emitting material layer emits white light, and the display device further includes a color filter placed on an optical path of the white light emitted from the emitting material layer.

According to an aspect of the invention, the plurality of sub-layers are different from one another in colors of emitted light.

According to an aspect of the invention, the display device further includes: a hole transport layer interposed between the first electrode and the emitting material layer; and an electron transport layer interposed between the emitting material layer and the second electrode.

According to an aspect of the invention, the electric charge transport material doped in the sub-layer adjacent to the hole transport layer among the plurality of sub-layers includes a hole transport material, and the electric charge transport material doped in the sub-layer adjacent to the electron transport layer among the plurality of sub-layers includes an electron transport material.

According to an aspect of the invention, the hole transport layer includes a first host and a first dopant for an electron accepting material, and the electron transport layer includes a second host and a second dopant for an electron donating material.

According to an aspect of the invention, a highest occupied molecular orbital (HOMO) energy level of the first host is lower than a lowest unoccupied molecular orbital (LUMO) energy level of the first dopant.

According to an aspect of the invention, the first electrode and the hole transport layer are in ohmic contact with each other.

According to an aspect of the invention, the first host includes at least one of N,N'-di[(1-naphthalenyl)-N,N'-diphenyl]-1,1'-biphenyl-4,4'-diamine(NPD)), 9,10-bis(m-tolyphenylamino)anthracene (TPA), and spiro-TPA.

According to an aspect of the invention, the first dopant includes tetrafluoro-tetracyano-quinodimethane (F4-TCNQ).

According to an aspect of the invention, a lowest unoccupied molecular orbital (LUMO) energy level of the second host is higher than a highest occupied molecular orbital (HOMO) energy level of the second dopant.

According to an aspect of the invention, the second electrode and the electron transport layer are in ohmic contact with each other.

According to an aspect of the invention, the second host includes tris(8-hydroxyquinolinolato)aluminum (Alq3).

According to an aspect of the invention, the second dopant includes one of cesium (Cs), barium (Ba) and calcium (Ca).

According to an aspect of the invention, the display device further includes a first blocking layer which is interposed between the hole transport layer and the emitting material layer, and has a higher lowest unoccupied molecular orbital (LUMO) energy level than the hole transport layer.

According to an aspect of the invention, the display device further includes a second blocking layer which is interposed between the electron transport layer and the emitting material layer, and has a lower highest occupied molecular orbital (HOMO) energy level than the electron transport layer.

The foregoing and/or other aspects of the present invention can be achieved by providing a display device: a first electrode; a hole transport layer which is formed on the first electrode; an emitting material layer which is formed on the hole transport layer and has a variable electric charge mobility along a thickness direction; an electron transport layer formed on the emitting material layer; and a second electrode formed on the electron transport layer.

According to an aspect of the invention, the emitting material layer includes a plurality of sub-layers which are staked in sequence and different from one another in colors of emitted light.

According to an aspect of the invention, at least one of the sub-layers includes: a first layer having a first electric charge mobility; a second layer having a second electric charge mobility lower than the first electric charge mobility.

According to an aspect of the invention, the first layer includes an electric charge transport material by a first content; and the second layer includes an electric charge transport material by a second content lower than the first content.

According to an aspect of the invention, the hole transport layer includes a first host and a first dopant for an electron accepting material, and the electron transport layer includes a second host and a second dopant for an electron donating material.

The foregoing and/or other aspects of the present invention can be achieved by providing a display device including a first electrode, a hole transport layer, an emitting material layer, an electron transport layer, and a second electrode, which are stacked in sequence, wherein the emitting material layer includes a plurality of sub-layers different in color of emitted light, and at least one of the sub-layers includes a first layer doped with an electric charge transport material by a first content and a second layer doped with an electric charge transport material by a second content higher than the first content.

According to an aspect of the invention, the hole transport layer includes a first host and a first dopant for an electron accepting material, and the electron transport layer includes a second host and a second dopant for an electron donating material.

BRIEF DESCRIPTION OF THE DRAWINGS

The above and/or other aspects of the present invention will become apparent and more readily appreciated from the following description of the exemplary embodiments, taken in conjunction with the accompanying drawings, in which.

DETAILED DESCRIPTION OF EXEMPLARY EMBODIMENTS OF THE INVENTION

Figure 1:
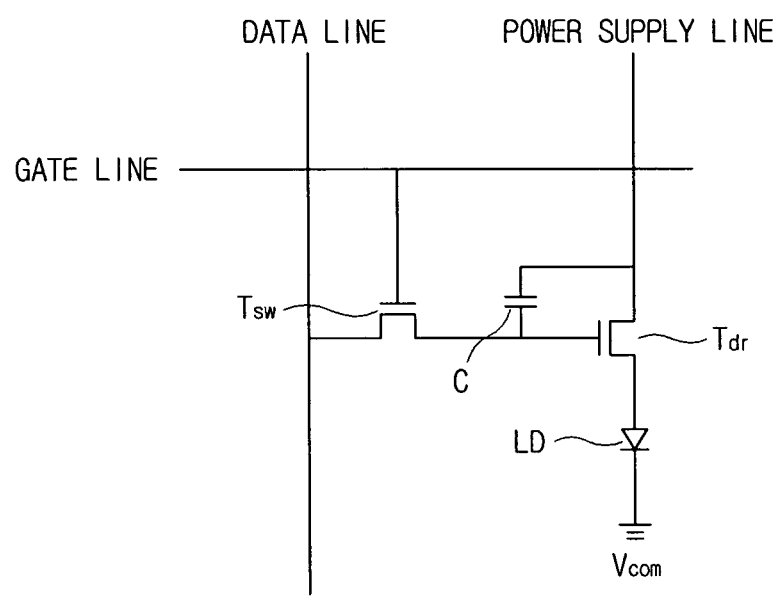
FIG. 1 is an equivalent circuit diagram of a display device according to a first exemplary embodiment of the present invention.

Reference is made in detail to the embodiments of the present invention, examples of which are illustrated in the accompanying drawings, wherein like reference numerals refer to like elements throughout. The embodiments are described below so as to explain the present invention by referring to the figures.

FIG. 1 is an equivalent circuit diagram for a pixel of a display device according to a first exemplary embodiment of the present invention.

In one pixel, a plurality of signal lines are provided. The signal lines include a gate line transferring a scanning signal, a data line transferring a data signal, and a power supply line transferring a driving voltage. The data line and the power supply line are arranged to be parallel and adjacent to each other, and the gate line is extended to be perpendicular to the data line and the power supply line.

Each pixel includes an organic light emitting diode LD, a switching thin film transistor Tsw, a driving thin film transistor Tdr, and a capacitor C.

The driving thin film transistor Tdr has a control terminal, an input terminal, and an output terminal, and the control terminal is connected to the switching thin film transistor Tsw. Also, the input terminal is connected to the power supply line, and the output terminal is connected to the organic light emitting diode LD.

The organic light emitting diode LD has an anode connected to the output terminal of the driving thin film transistor Tdr and a cathode through which a common voltage is inputted. The organic light emitting diode LD varies a strength of the emitting light according to an output voltage of the driving thin film transistor Tdr to display an image. A magnitude of a current of the driving thin film transistor Tdr varies according to a voltage between the control terminal and the output terminal.

The switching thin film transistor Tsw also has a control terminal, an input terminal, and an output terminal, and the control terminal is connected to the gate line. In addition, the input terminal is connected to the data line, and the output terminal is connected to the control terminal of the driving thin film transistor Tdr. The switching thin film transistor Tsw transfers data signal inputted to the data line according to scanning signal inputted to the gate line to the driving thin film transistor Tdr.

The capacitor C is connected with the control terminal and the input terminal of the driving thin film transistor Tdr. The capacitor C is charged with data signal inputted to the control terminal of the driving thin film transistor Tdr and holds it up.

Figure 2:
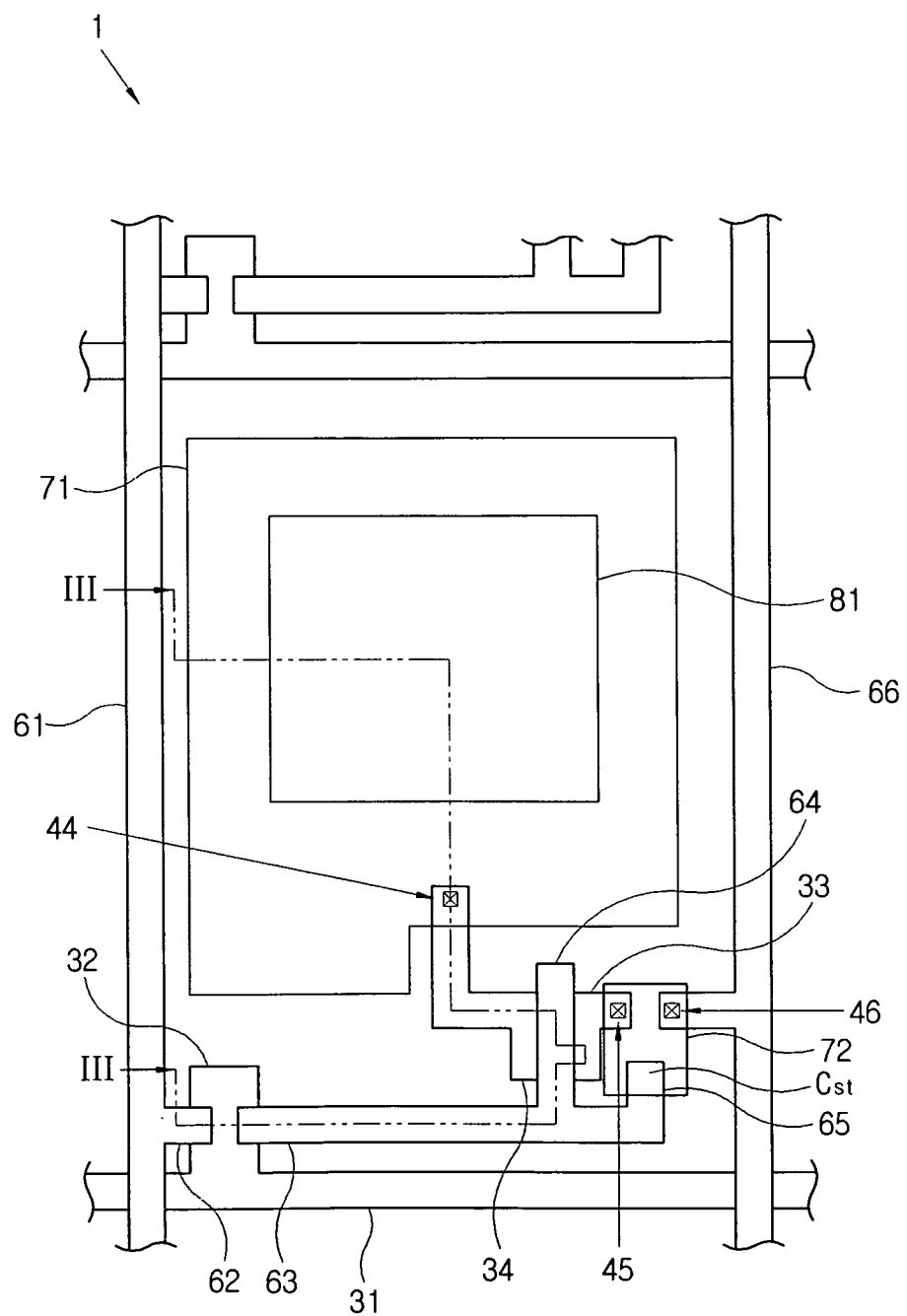
FIG. 2 is a layout diagram of the display device according to the first exemplary embodiment of the present invention.
Figure 3:
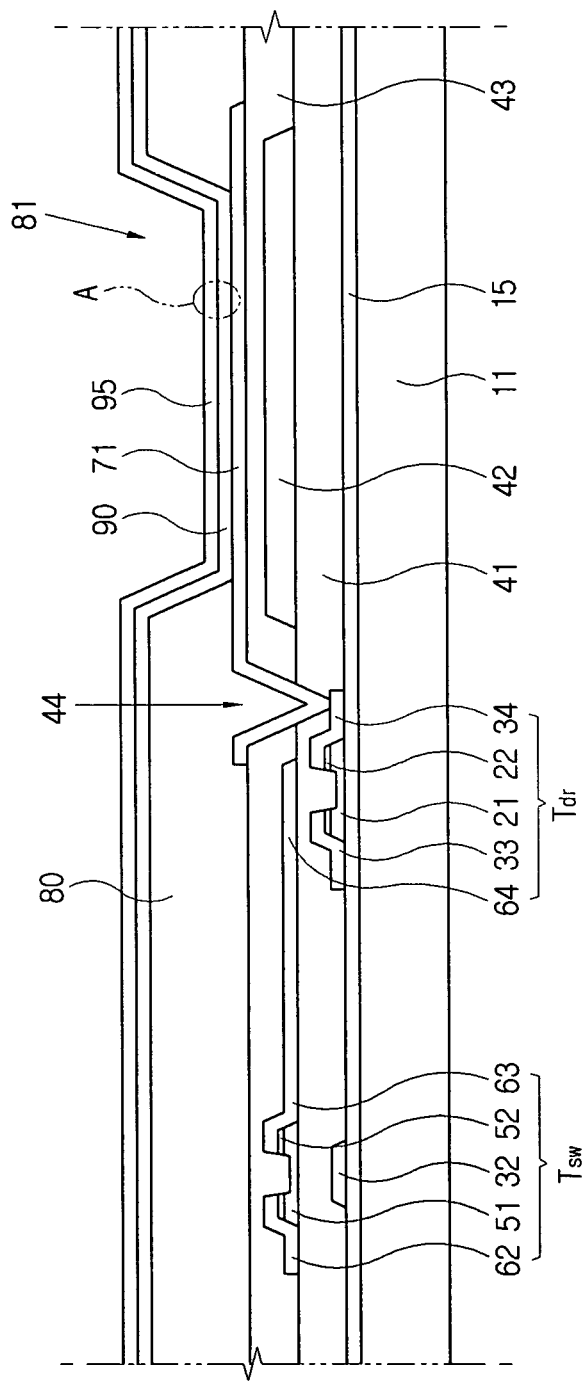
FIG. 3 is a cross sectional view of the display device, taken along line III-III of FIG. 2.

Referring to FIGS. 2 and 3, the display device according to the first embodiment of the present invention will be described in detail.

A buffer layer 15 is formed on an insulating substrate 11. The buffer layer 15 may include silicon oxide, and prevents impurities of the insulating substrate 11 from being introduced into an amorphous silicon layer while crystallizing the amorphous silicon layer.

A driving semiconductor layer 21 and a driving ohmic contact layer 22 are formed on the buffer layer 15. The driving semiconductor layer 21 and the driving ohmic contact layer 22 include poly silicon.

The driving semiconductor layer 21 and the driving ohmic contact layer 22 are formed by depositing, crystallizing, and patterning the amorphous silicon layer and an amorphous ohmic contact layer. Here, solid phase crystallization may be used in crystallizing the amorphous silicon layer and the amorphous ohmic contact layer.

A first metal layer is formed on the buffer layer 15, the driving semiconductor layer 21 and the driving ohmic contact layer 22.

The first metal layer includes a gate line 31, switching gate electrode 32, a driving source electrode 33 and a driving drain electrode 34. The gate line 31 and the switching gate electrode 32 are formed as a single body.

A first insulating layer 41 is formed on the first metal layer. The first insulating layer 41 may include silicon nitride.

On the first insulating layer 41, a switching semiconductor layer 51 and a switching ohmic contact layer 52 are formed. The switching semiconductor layer 51 and the switching ohmic contact layer 52 correspond to the switching gate electrode 32, and may include amorphous silicon.

A second metal layer is formed on the first insulating layer 41, the switching semiconductor layer 51 and the switching ohmic contact layer 52. In addition, on the first insulating layer 41 below a pixel electrode 71, a color filter 42 is formed.

The second metal layer includes a data line 61, a switching source electrode 62, a switching drain electrode 63, a driving gate electrode 64, a storage capacity line 65, and a power supply line 66.

The data line 61 and the switching source electrode 62 are formed as a single body. The switching drain electrode 63, the driving gate electrode 64, and the storage capacity line 65 are also formed as a single body.

A second insulating layer 43 is formed on the second metal layer. The second insulating layer 43 if referred to as an overcoat layer, and may include organic materials. As organic materials, one of benzocyclobutene (BCB) series, olefine series, acrylic resin series, polyimide series, and fluorine resin may be used.

Contact holes 44, 45, and 46 are formed on the second insulating layer 43. The contact hole 44 exposes the driving drain electrode 34; the contact hole 45 exposes the driving source electrode 33; and the contact hole 46 exposes the power supply line 66. In the contact holes 44 and 45, the first insulating layer 41 is also removed.

A transparent conducting layer is formed on the second insulating layer 43. The transparent conducting layer includes a pixel electrode 71 and a bridge electrode 72, and may be made of indium tin oxide (ITO) or indium zinc oxide (IZO).

The pixel electrode 71 is electrically connected to the driving drain electrode 34 via the contact hole 44. The bridge electrode 72 electrically connects the switching source electrode 33 with the power supply line 66 via the contact holes 45 and 46. The storage capacity line 65 is extended below the bridge electrode 72 to form a storage capacitor Cst.

A wall 80 is formed on the second insulating layer 43. The wall 80 separates the pixel electrodes 71 from each other, and is partially removed to form an aperture region 81 through which the pixel electrode 71 is exposed.

An organic layer 90 is formed on both the wall 80 and the pixel electrode 71 exposed through the aperture region 81. The organic layer 90 includes an emitting material layer 920 (refer to FIG. 4) to emit white light, which will be described later.

A region where the pixel electrode 71 and the organic layer 90 are in direct contact with each other will be called a pixel region. In this embodiment, the pixel region approximately corresponds to the aperture region 81, and light is mostly generated in the pixel region.

A common electrode 95 is formed on the wall 80 and the organic layer 90. The common electrode 95 includes a reflective metal layer.

Holes from the pixel electrode 71 and electrons from the common electrode 95 are combined in the organic layer 90 into excitons. While the excitons are deactivated, light is emitted. Some of the light generated in the organic layer 90, which travel toward the common electrode 95, are reflected from the common electrode 95 toward the pixel electrode 71.

The light toward the pixel electrode 71 gets colors while passing through the color filters 42, and then travels to the outside through the insulating substrate 11. This is called a bottom-emission type.

According to another exemplary embodiment of the present invention, the pixel electrode 71 may includes a reflective metal, and the common electrode 95 may be transparent. In this case, light travels to the outside through the common electrode 95, which is called a top-emission type. Accordingly, the color filter 42 is formed above the common electrode 95.

The organic layer 90 is described below in more detail with reference to FIGS. 4 and 5.

Figure 4:
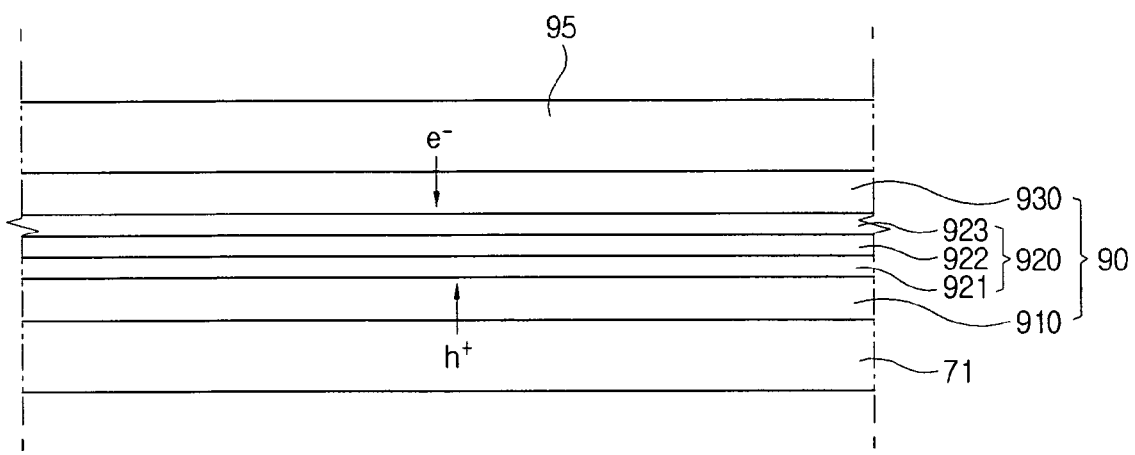
FIG. 4 is an enlarged view of region "A" in FIG. 3.

As shown in FIG. 4, the organic layer 90 includes a hole transport layer (HTL) 910, an emitting material layer (EML) 920, and an electron transport layer (ETL) 930.

The hole transport layer 910 is in direct contact with the pixel electrode 71 and transfers the holes from the pixel electrode 71 to the emitting material layer 920.

The hole transport layer 910 includes a first host used as a hole transport material and a first dopant used as an electron accepting material.

Figure 5:
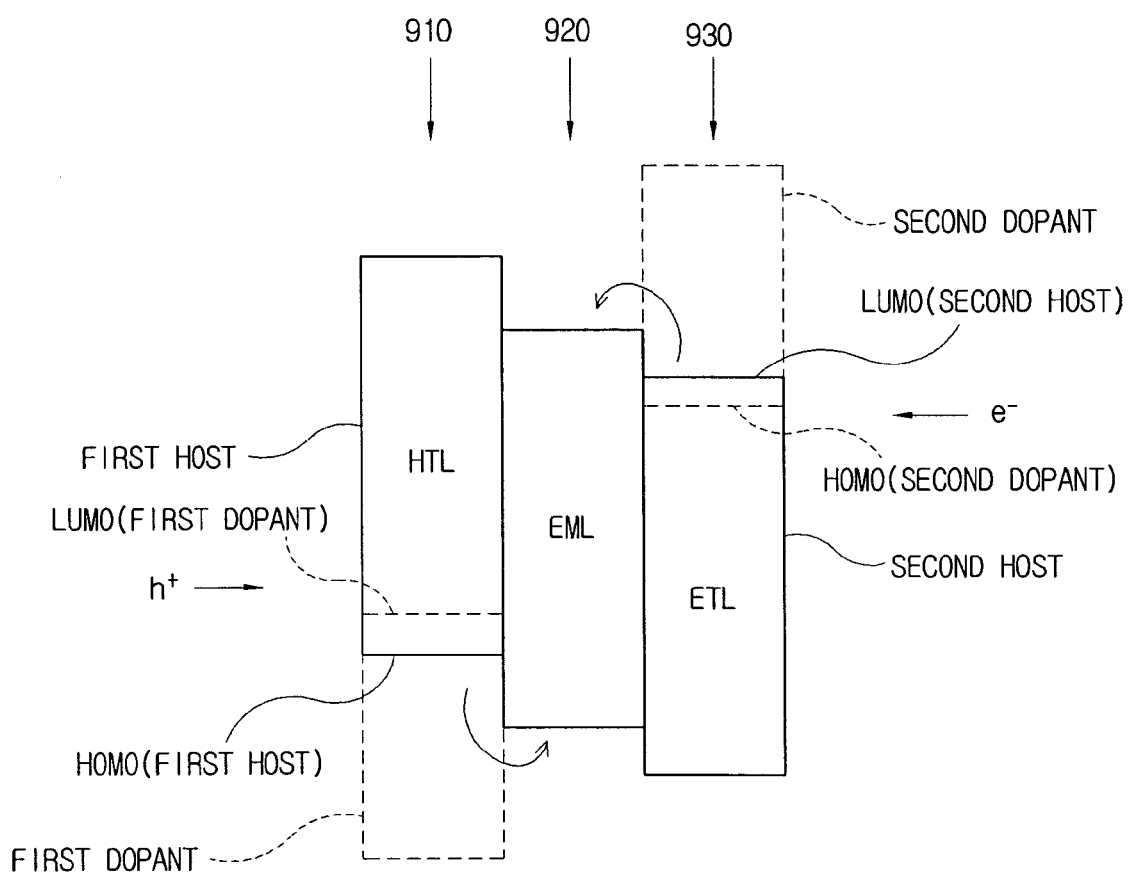
FIG. 5 illustrates energy levels of an organic layer in the display device according to the first exemplary embodiment of the present invention.

As shown in FIG. 5, the highest occupied molecular orbital (HOMO) of the first host has an energy level lower than an energy level of the lowest unoccupied molecular orbital (LUMO) of the first dopant.

With this energy distribution, the electrons positioned in the HOMO of the first host can easily move to the LUMO of the first dopant. Such electron movement causes equilibrium charge concentration of the hole transport layer 910 to increase, so that the holes from the pixel electrode 71 can be introduced into the hole transport layer 910 without an energy barrier. That is, the pixel electrode 71 and the hole transport layer 910 are in ohmic contact with each other.

The first host may include N,N'-di[(1-naphthalenyl)-N,N'-diphenyl]-1,1'-biphenyl-4,4'-diamine(NPD)), 9,10-bis(m-tolyphenylamino)anthracene (TPA), and spiro-TPA, but not limited thereto. The first dopant may include tetrafluoro-tetracyano-quinodimethane (F4-TCNQ), but not limited thereto.

The electron transport layer 930 is in direct contact with the common electrode 95 and transfers the electrons from the common electrode 95 to the emitting material layer 920.

The electron transport layer 930 includes a second host used as an electron transport material and a second dopant used as an electron donating material.

As shown in FIG. 5, the lowest unoccupied molecular orbital (LUMO) of the second host has an energy level higher than an energy level of the highest occupied molecular orbital (HOMO) of the second dopant. With this energy distribution, the electrons positioned in the HOMO of the second dopant can easily move to the LUMO of the second host. Such electron movement causes equilibrium charge concentration of the electron transport layer 930 to increase, so that the electrons of the common electrode 95 can be introduced into the electron transport layer 930 without an energy barrier. That is, the common electrode 95 and the electron transport layer 930 are in ohmic contact with each other.

The second host may include tris(8-hydroxyquinolinolato) aluminum (Alq3), or compounds of oxidazole series, but not limited thereto. The second dopant may include at least one selected from a group consisting of cesium (Cs), barium (Ba) and calcium (Ca), but is not limited thereto.

Returning to FIG. 4, the emitting material layer 920 includes three sub-layers 921, 922 and 923. The sub-layers 921, 922 and 923 include a red light emitting layer 921, a blue light emitting layer 922 and a green light emitting layer 923.

The red light emitting layer 921 is in contact with the hole transport layer 910, the green light emitting layer 923 is in contact with the electron transport layer 930. The blue light emitting layer 922 is placed between the red and green light emitting layers 921 and 923. The sub-layers 921, 922, and 923 are stacked in order of red, blue, and green light emitting layers, but not limited thereto.

Each of the sub-layers 921, 922 and 923 has a host-dopant structure. The dopant of each sub-layers 921, 922, 923 serves as a coloring matter. The host may include a carbazole biphenyl (CBP), but not limited thereto.

The dopant for the red light emitting layer 921 may include a rubrene; the dopant for the blue light emitting layer 922 may include 1,1,4,4-tetraphenyl-1,3-butadien (TPB); and the dopant for the green light emitting layer 923 may include quinacridone, coumarine, Ir(ppy3), etc.

Alternatively, some of the sub-layers 921, 922 and 923 may have the host-dopant structure, or all sub-layers 921, 922 and 923 may not have the host-dopant structure.

The emitting material layer 920 combines the holes from the hole transport layer 910 with the electrons from the electron transport layer 930, thereby emitting light. However, if the emitting material layer 920 includes the plurality of sub-layers 921, 922 and 923, it is difficult for each of the sub-layers 921, 922 and 923 to balance the supply of the electrons and the holes.

According to an exemplary embodiment of the present invention, the emitting material layer 920 is doped with an electron transport material so as to keep supply balance between the electrons and the holes, which is described below with reference to FIGS. 6 and 7.

In the following description, % denotes wt %. Further, no certain material may be expressed as a certain material is given at a low content or the content thereof is low.

Figure 6:
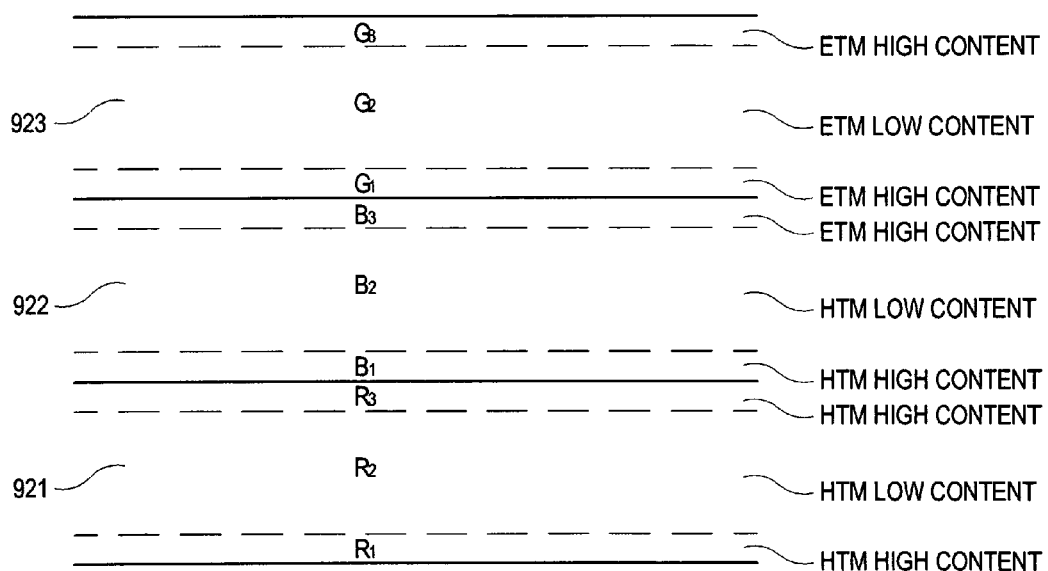
FIG. 6 is a diagram for explaining an emitting material layer of the display device according to the first exemplary embodiment of the present invention.

As will be appreciated by reference to FIG. 6, the red light emitting layer 921 includes a first layer R1, a second layer R2, and a third layer R3.

The first layer R1 is doped with a hole transport material at a high content. The content of the hole transport material in the first layer R1 may range from 20% to 50%, but is not limited thereto.

The second layer R2 is doped with a hole transport material at a low content. The content of the hole transport material in the second layer R2 may be 10% or the less, that is, range from 2% to 10%, but is not limited thereto.

The third layer R3 is doped with a hole transport material at a high content. The content of the hole transport material in the third layer R3 is similar to that of the first layer R1.

The second layer R2 in the red light emitting layer 921 is interposed between the first layer R1 and the third layer R3. The first layer R1 is in contact with the hole transport layer 910, and the third layer R3 is in contact with the blue light emitting layer 922.

The thickness of the first layer R1 is similar to that of the third layer R3. The second layer R2 is thicker than the first layer R1 and the second layer R2, and may be thicker than the sum of the first layer R1 and the third layer R3.

The thicknesses of the first layer R1 and the third layer R3 may range from 5% to 20% of the thickness of the red light emitting layer 921, respectively, and the thickness of the second layer R2 may range from 60% to 90% of the thickness of the red light emitting layer 921, but not limited thereto. The thickness of the red light emitting layer 921 may range from 6 nm to 20 nm.

The blue light emitting layer 922 includes a first layer B1, a second layer B2, and a third layer B3.

The first layer B1 is doped with a hole transport material at a high content. The content of the hole transport material in the first layer B1 may range from 20% to 50%, but is not limited thereto.

The second layer B2 is doped with a hole transport material at a low content. The content of the hole transport material in the second layer R2 may be 10% or the less, that is, range from 2% to 10%, but is not limited thereto.

The third layer B3 is doped with an electron transport material (ETM) at a high content. The content of the electron transport material in the third layer B3 may range from 20% to 50%, but is not limited thereto.

The second layer B2 in the blue light emitting layer 922 is interposed between the first layer B1 and the third layer B3. The first layer B1 is in contact with the red light emitting layer 921, and the third layer B3 is in contact with the green light emitting layer 923.

The thickness of the first layer B1 is similar to that of the third layer B3. The second layer B2 is thicker than the first layer B1, and the second layer B2 may be thicker than the sum of the first layer B1 and the third layer B3.

The thicknesses of the first layer B1 and the third layer B3 may range from 5% to 20% of the thickness of the blue light emitting layer 922, respectively, and the thickness of the second layer B2 may range from 60% to 90% of the thickness of the blue light emitting layer 922, but not limited thereto. The thickness of the blue light emitting layer 922 may range from 6 nm to 20 nm.

The green light emitting layer 923 includes a first layer G1, a second layer G2, and a third layer G3.

The first layer G1 is doped with an electron transport material at a high content. The content of the electron transport material in the first layer G1 may range from 20% to 50%, but is not limited thereto.

The second layer G2 is doped with an electron transport material at a low content. The content of the electron transport material in the second layer G2 may be 10% or the less, that is, range from 2% to 10%, but is not limited thereto.

The third layer G3 is doped with an electron transport material at a high content. The content of the electron transport material in the third layer G3 may range from 20% to 50%, but is not limited thereto.

The second layer G2 in the green light emitting layer 923 is interposed between the first layer G1 and the third layer G3. The first layer G1 is in contact with the blue light emitting layer 922, and the third layer G3 is in contact with the electron transport layer 930.

The thickness of the first layer G1 is similar to that of the third layer G3. The second layer G2 is thicker than the first layer G1, and the second layer G2 may be thicker than the sum of the first layer G1 and the third layer G3.

The thicknesses of the first layer G1 and the third layer G3 may range from 5% to 20% of the thickness of the green light emitting layer 923, respectively, and the thickness of the second layer G2 may range from 60% to 90% of the thickness of the green light emitting layer 923, but not limited thereto. The thickness of the green light emitting layer 923 may range from 6 nm to 20 nm.

The hole transport material to be doped into the emitting material layer 920 may be used as the same material for the first host of the hole transport layer 910, and the electron transport material may be used as the same material for the second host of the electron transport layer 930.

As described above, the emitting material layer 920 is doped with the electric charge transport materials at non-uniform content along a thickness direction of the emitting material layer 920. In each of sub-layers 921, 922 and 923, the content of the electric charge transport materials is low in a middle part thereof, but high in a boundary part.

The electric charge transport material includes the hole transport material and the electron transport material. The hole transport material is distributed adjacent to the hole transport layer 910, and the electron transport material is distributed adjacent to the electron transport layer 930.

The non-uniformly doped electric charge transport material causes the mobility of electric charges to vary along the thickness of the emitting material layer 920.

Figure 7:
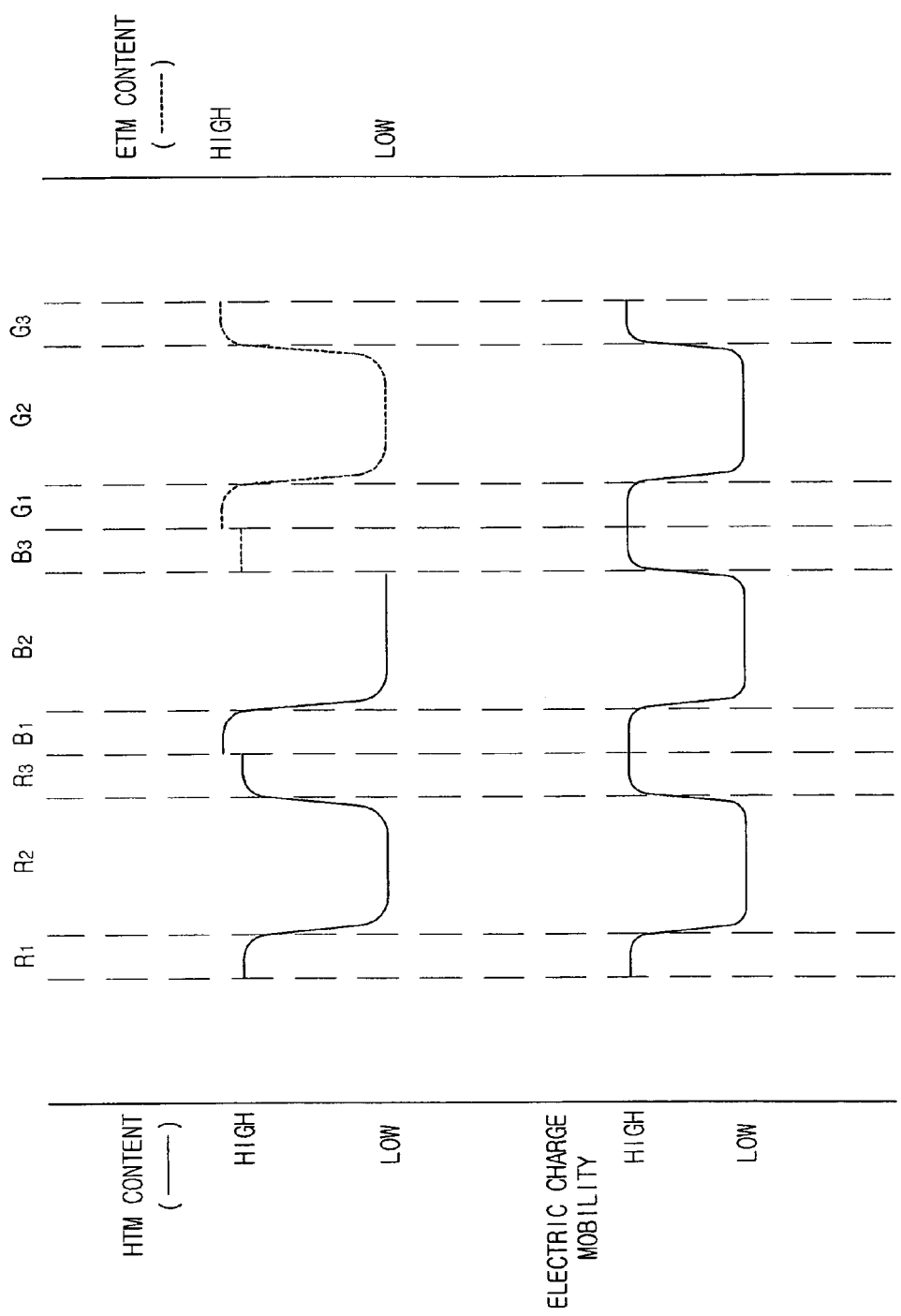
FIG. 7 is a diagram for explaining a relation between an electric charge transport material contents and an electric charge movement degree of the display device according to the first exemplary embodiment of the present invention.

Referring to FIG. 7, the mobility of electric charges in each of the middle layers R2, B2, and G2 of the sub-emitting material layer 921, 922, and 923 is low. The mobility of electric charges in the middle layers R2, B2, and G2 may be lowered as compared with that of when no electric charge transport material is included in the middle layers R2, B2 and G2 because a relatively low content of the electric charge transport material may act as a trap that interrupts the movement of the electric charges.

The mobility of electric charges in each of outer layers R1, R3, B1, B3, G1, and G3 of each sub-emitting material layers 921, 922 and 923 is high. More specifically, in outer layers R1, R3, and B1, the high content of the hole transport material brings high mobility of holes, and in outer layers B3, G1, and G3, the high content of the electron transport material brings high mobility of electrons.

Figure 8:
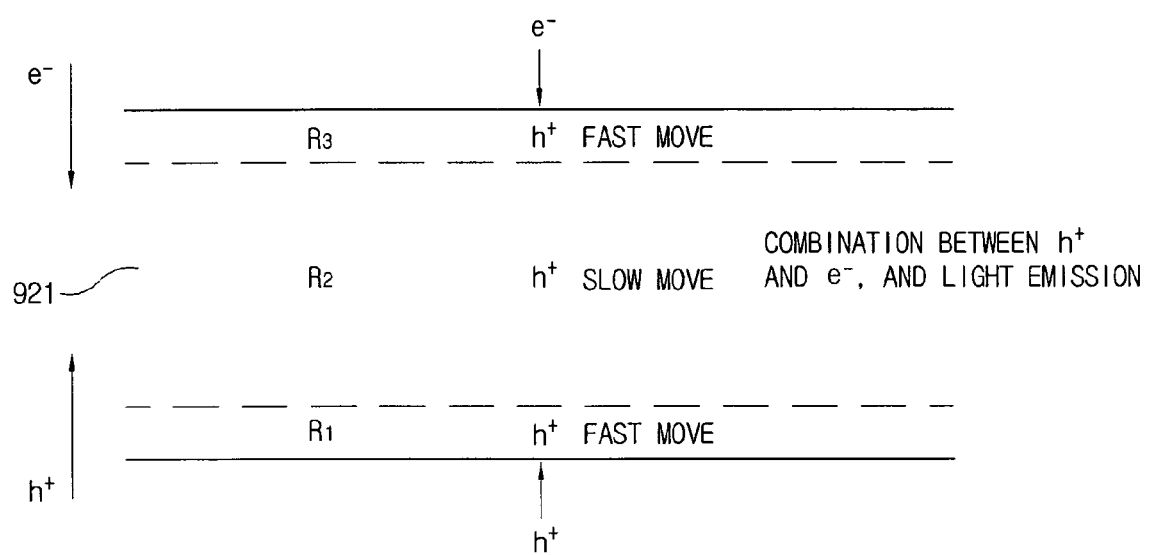
FIG. 8 is a diagram for explaining a movement of charge in the emitting material layer 921 of the display device according to the first exemplary embodiment of the present invention.

Electric charge availability may be high according to the first embodiment described above, which will be described with reference to FIG. 8. FIG. 8 shows movement of electric charges and light emitting mechanism in the emitting material layer of the red light emitting layer 921.

A hole h+ transported through the hole transport layer 910 is smoothly supplied to the second layer R2 via the first layer R1 in which the mobility of the hole is high.

Because the second layer R2 has a low hole mobility and is thick, the hole stays for a relatively long time in the second layer R2 as compared with the first layer R1. The longer the staying time for the hole, the higher the probability of recombination between the hole and the electron. Accordingly, most of the red light is emitted in the second layer R2.

The hole, which is not combined with the electron in the second layer R2, moves to the third layer R3. The third layer R3 has a high hole mobility, so that the hole is quickly supplied to the blue light emitting layer 922.

As described above, the hole, which is not combined with the electron in the red light emitting layer 921, quickly moves to the blue light emitting layer 922, thereby enhancing the electric charge availability. Further, the probability of the recombination between the electron and the hole increases through the second layer R2 having a low hole mobility.

Other sub-layers 922 and 923 are also increased in the probability of the recombination between the electron and the hole in the middle layer B2 and G2. Further, the outer layers B1, B3, G1 and G3 are used for quickly moving the electric charges that are not combined with the counter electric charges.

Figure 9:
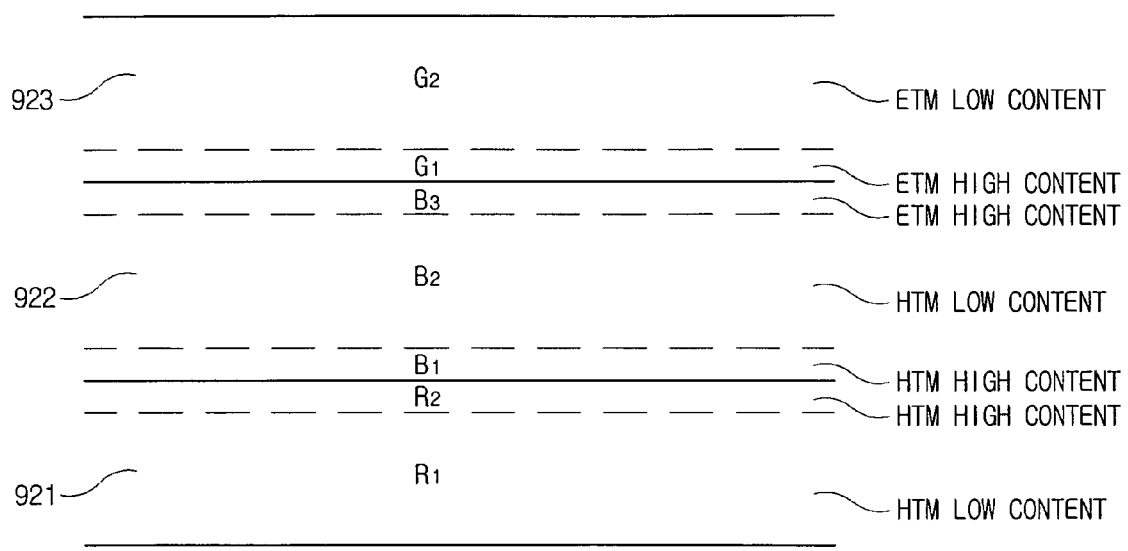
FIG. 9 is a diagram for explaining an alternative emitting material layer of the display device according to a second exemplary embodiment of the present invention.

A second exemplary embodiment of the present invention will be described with reference to FIG. 9. The second exemplary embodiment is different from the first exemplary embodiment in a structure of a red light emitting layer 921 and a green light emitting layer 923.

The red light emitting layer 921 includes a first layer R1 and a second layer R2.

The first layer R1 contacts a hole transport layer 910 and is lowly doped with a hole transport material. The second layer R2 contacts a blue light emitting layer 922 and is highly doped with the hole transport material.

The first layer R1 is thicker than the second layer R2, and red light is mainly emitted from the first layer R1.

The green light emitting layer 923 includes a first layer G1 and a second layer G2.

The first layer G1 contacts a blue light emitting layer 922 and is highly doped with an electron transport material. The second layer G2 contacts an electron transport layer 930 and is lowly doped with the electron transport material.

The second layer G2 is thicker than the first layer G1, and green light is mainly emitted from the second layer G2.

Figure 10:
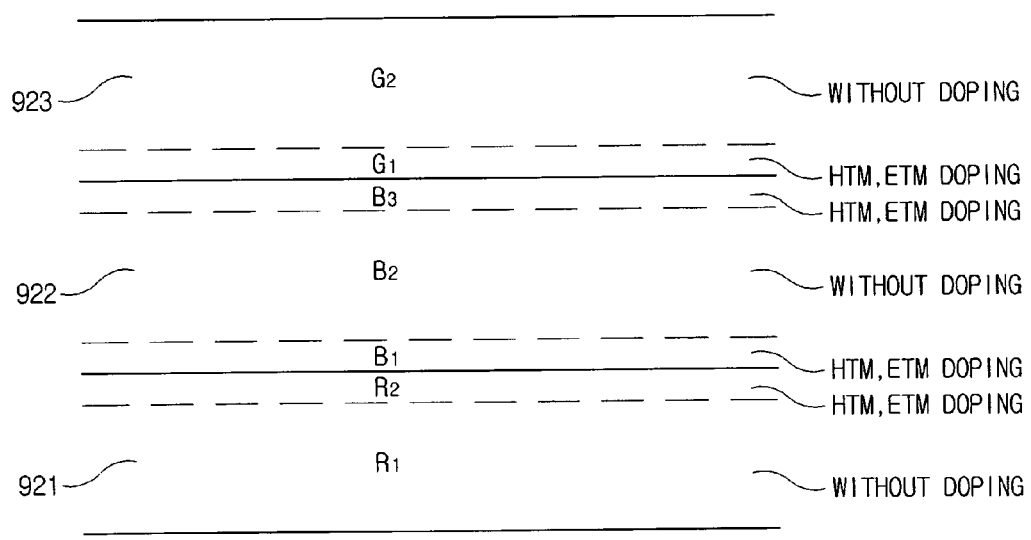
FIG. 10 is a diagram for explaining a further emitting material layer of the display device according to a third exemplary embodiment of the present invention.

A third exemplary embodiment of the present invention is described below with reference to FIG. 10.

A red light emitting layer 921 includes a first layer R1 and a second layer R2.

The first layer R1 contacts a hole transport layer 910 and is not doped with an electric charge transport material. The second layer R2 contacts a blue light emitting layer 922 and is doped with the hole transport material and an electron transport material.

The first layer R1 is thicker than the second layer R2, and red light is mainly emitted from the first layer R1.

The blue light emitting layer 922 is divided into a first layer B1, a second layer B2 and a third layer B3.

The first layer B1 contacts the red light emitting layer 921, and the third layer B3 contacts a green light emitting layer 923.

The first layer B1 and the third layer B3 are doped with both the hole transport material and the electron transport material. However, the second layer B2 placed between the first layer B1 and the third layer B3 are not doped with such electric charge transport materials.

The second layer B2 is thicker than the first and third layers B1 and B3, and blue light is mainly emitted from the second layer B2.

The green light emitting layer 923 includes a first layer G1 and a second layer G2.

The first layer G1 contacts the blue light emitting layer 922, and is doped with both the hole transport material and the electron transport material. The second layer G2 contacts the electron transport layer 930 and is not doped with such electric charge transport materials.

The second layer G2 is thicker than the first layer G1, and green light is mainly emitted from the second layer G2.

In the third exemplary embodiment, both the electron transport material and the hole transport material are doped on the boundaries between the sub-layers 921, 922 and 923. Accordingly, the electron and the hole, which are not doped with each other, are all quickly moved to another layer.

Figure 11:
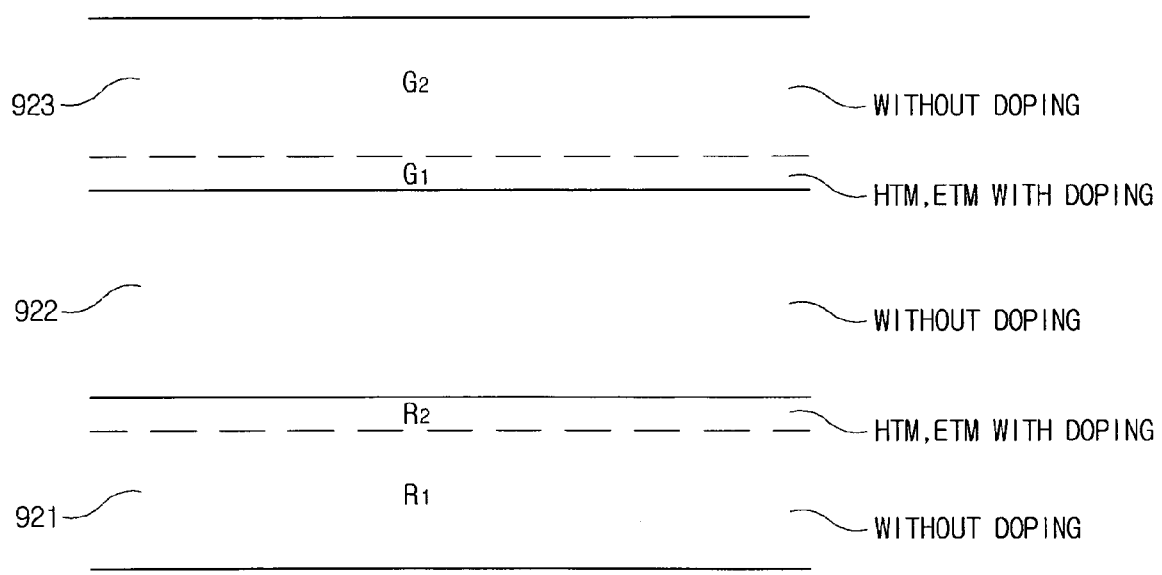
FIG. 11 is a diagram for explaining another emitting material layer of the display device according to a fourth exemplary embodiment of the present invention.

A fourth exemplary embodiment of the present invention will be described with reference to FIG. 11.

A red light emitting layer 921 and a green light emitting layer 923 according to the fourth exemplary embodiment have the same structure with those of the third exemplary embodiment. However, the blue light emitting layer 922 is not doped with an electric charge transport material.

Figure 12A:
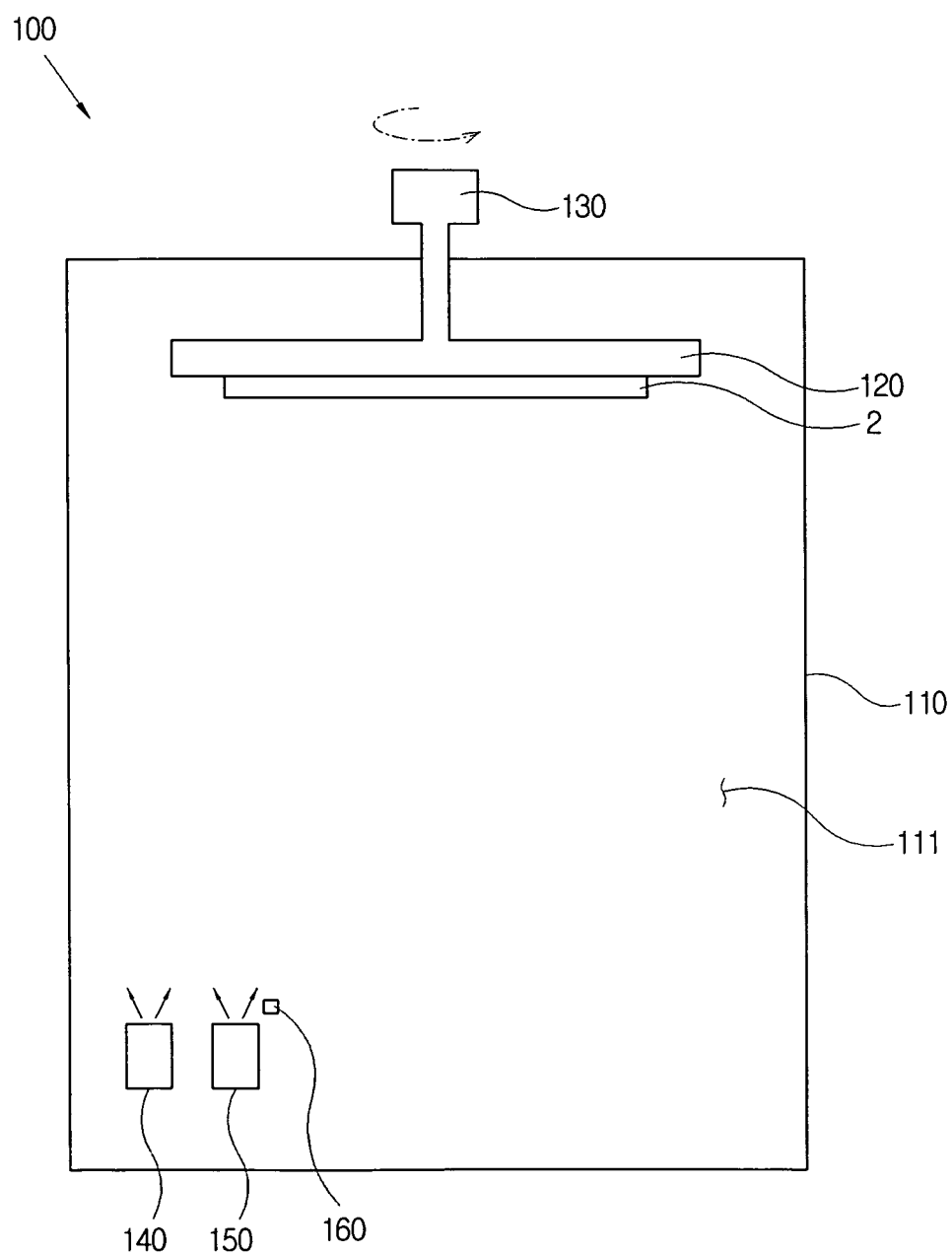
FIGS. 12A and 12B are diagrams for explaining a manufacturing method of a display device according to an exemplary embodiment of the present invention.
Figure 12B:
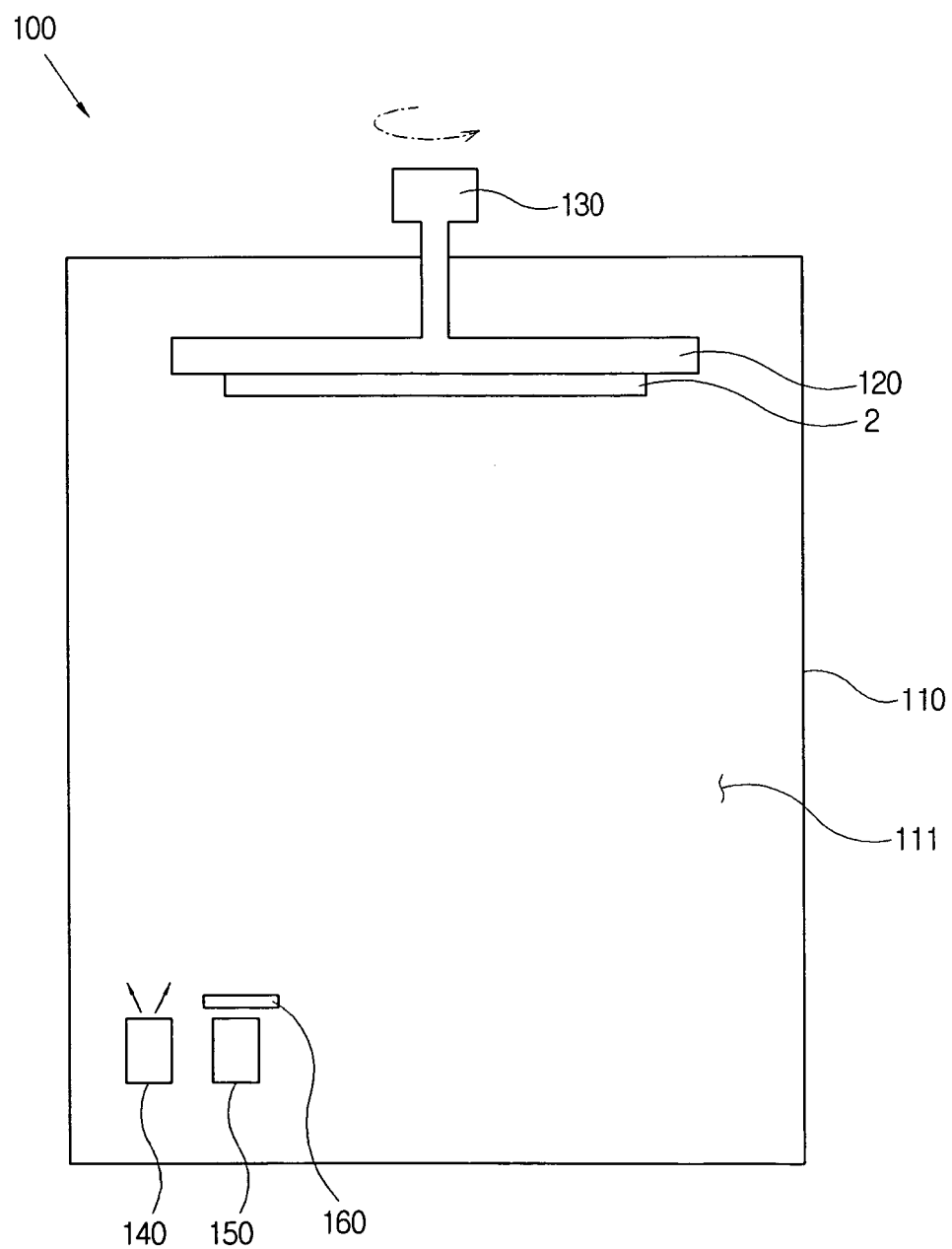

Below, a method of manufacturing a display device according to an exemplary embodiment of the present invention is described with reference to FIGS. 12A and 12B. FIGS. 12A and 12B show an evaporation apparatus to form a thin film having a host-dopant structure. In this exemplary embodiment, the hole transport layer 910, the sub layers 921, 922 and 923, and the electron transport layer 930 have the host-dopant structure.

The evaporation apparatus 100 includes a vacuum chamber 110 forming an evaporating space 111, a substrate supporter 120 placed in a upper portion of the evaporating space 111, and a driver 130 connected to the substrate supporter 120 and rotating the substrate supporter 120.

While forming the thin film, a substrate 2 to be formed with the thin film is mounted to the substrate supporter 120, and a first source 140 containing a host material and a second source 150 containing a dopant material are placed in a lower portion of the evaporation space 111.

In the case of forming the hole transport layer 910, a dopant material may include an electron accepting material. In the case of forming the electron transport layer 930, the dopant material may include an electron donating material. In the case of forming the sub-layers 921, 922 and 923, the dopant material may include the hole transport material or the electron transport material.

When the first source 140 and the second source 150 are heated, vapor of both the host material and the dopant material is supplied to the substrate 2. The vapor of the host and dopant materials contacts the substrate 2 and is cooled to form the thin film. While forming the thin film, the substrate 2 is rotated to thereby form the thin film uniformly.

If temperature of the second source 150 is low, evaporating speed becomes lower so that the content of the dopant decreases. On the other hand, if the temperature of the second source 150 is high, evaporating speed becomes higher so that the content of the dopant increases.

Meanwhile, an opening/closing part 160 is provided on the top of the second source 150. The opening/closing part 160 alternates between an opened state (refer to FIG. 12A) and a closed state (refer to FIG. 12B). The opening/closing part 160 is used in controlling more detail doping of the dopant.

Figure 13:
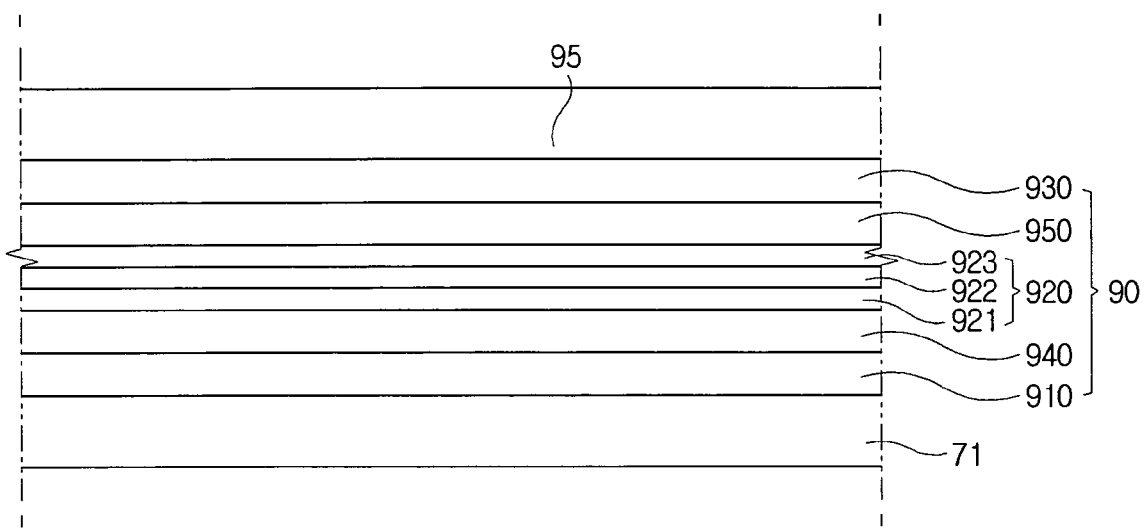
FIG. 13 is a diagram for explaining a configuration of an organic layer of a display device according to a fifth exemplary embodiment of the present invention.
Figure 14A:
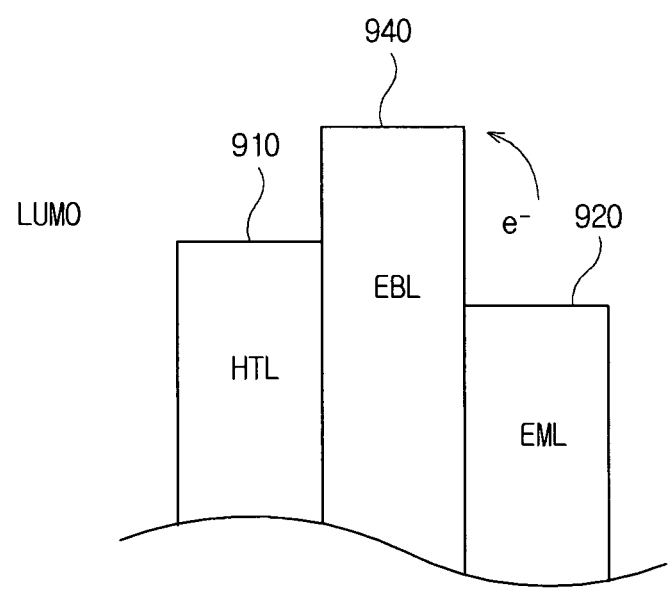
FIGS. 14A and 14B illustrate energy levels of the organic layer in the display device according to the fifth exemplary embodiment of the present invention.
Figure 14B:
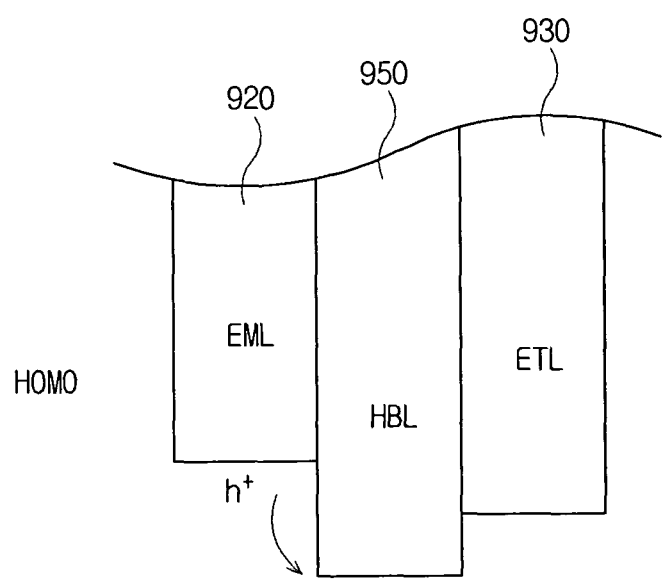

A display device according to a fifth exemplary embodiment of the present invention is described below with reference to FIGS. 13, 14A and 14B. FIG. 13 is an enlarged view corresponding to an "A" part in FIG. 2.

Referring to FIG. 13, a first blocking layer 940 is interposed between a hole transport layer 910 and an emitting material layer 920, and a second blocking layer 950 is interposed between the emitting material layer 920 and the electron transport layer 930.

The hole transport layer 910 includes a first host as a hole transport material, and a first dopant as an electron accepting material. The electron transport layer 930 includes a second host as the electron transport material, and a second dopant as an electron donating material.

Further, the emitting material layer 920 is doped with an electric charge transport material to make concentration vary along a thickness direction.

The first blocking layer 940 includes a hole transport material. As shown in FIG. 14A, the first blocking layer 940 has a higher lowest unoccupied molecular orbital (LUMO) energy level than the hole transport layer 910, so that it is difficult to move the electrons from the emitting material layer 920 to the first blocking layer 940. The first blocking layer 940 reduces the number of electrons that move to the hole transport layer 910 without combining with the holes in the emitting material layer 920, thereby increasing electric charge availability.

The second blocking layer 950 includes an electron transport material. As shown in FIG. 14B, the second blocking layer 950 has a lower highest occupied molecular orbital (HOMO) energy level than the electron transport layer 930, so that it is difficult to move the holes from the emitting material layer 920 to the second blocking layer 950.

The second blocking layer 950 reduces the number of holes that move to the electron transport layer 930 without combining with the electrons in the emitting material layer 920, thereby increasing electric charge availability.

According to the exemplary embodiments of the present invention, the electric charge availability increases so that driving voltage decreases, thereby reducing power consumption.

As described above, the present invention provides a display device with excellent electric charge availability.

Although a few exemplary embodiments of the present invention have been shown and described, it will be appreciated by those skilled in the art that changes may be made in these embodiments without departing from the principles and spirit of the invention, the scope of which is defined in the appended claims and their equivalents.

What is claimed is:

1. A display device comprising:
a first electrode;
a second electrode; and
a light emitting material layer interposed between the first electrode and the second electrode, the light emitting material layer being doped with an electric charge transport material having a content which varies along a thickness direction of the layer, the emitting material layer comprising a plurality of sub-layers stacked in a sequence,
wherein at least one of the sub-layers comprises:
a pair of first regions doped with the electric charge transport material to a first content; and
a second region doped with the electric charge transport material to a second content lower than the first content, wherein the second region is positioned between the pair of first regions,
wherein at least another one of the sub-layers comprises:
a third region doped with the electric charge transport material to a third content, wherein the third region is positioned outside the first region;
a fourth region doped with the electric charge transport material to a fourth content lower than the third content and the first content, wherein the fourth region is positioned outside the third region,
wherein the fourth region is placed in an outmost part of the emitting material layer, wherein a first of the pair of first regions is doped with a first electric charge transport material and a second of the pair of first regions is doped with a second electric charge transport material different from the first electric charge transport material, wherein the third region and the fourth region are doped with the first electric charge transport material or the second electric charge transport material, and the third region is doped with a same electric charge transport material as the fourth region.

2. The display device according to claim 1, wherein a thickness of the second region is greater than a sum of a thickness of the pair of first regions.

3. The display device according to claim 1, wherein at least one of the first regions contacts another one of the sub-layers.

4. The display device according to claim 1, wherein a thickness of the fourth region is greater than a thickness of the third region.

5. The display device according to claim 1, wherein the emitting material layer emits white light, and the display device further comprises a color filter placed on an optical path of the white light emitted from the emitting material layer.

6. The display device according to claim 1, wherein one of the plurality of sub-layers is adapted to emit light having a color different than a color of light emitted by another of the sub-layers.

7. A display device;

a first electrode;

a hole transport layer which is formed on the first electrode;

an emitting material layer which is formed on the hole transport layer and has a variable electric charge mobility along a thickness direction;

an electron transport layer formed on the emitting material layer; and a second electrode formed on the electron transport layer, wherein the emitting material layer comprises a plurality of sub-layers which are stacked in sequence and different from one another in colors of emitted light, and wherein at least one of the sub-layers comprises:

a pair of first layers having a first electric charge mobility;

a second layer having a second electric charge mobility lower than the first electric charge mobility, wherein the second layer is positioned between the pair of first layers, wherein at least another one of the sub-layers comprises:

a third layer having a third electric charge mobility, wherein the third layer is positioned outside the first layer; and a fourth layer having a fourth electric charge mobility lower than the third electric charge mobility and the first electric charge mobility, wherein the fourth layer is positioned outside and the third layer, wherein the fourth layer is placed in an outmost part of the emitting material layer, wherein a first of the pair of first regions is doped with a first electric charge transport material and a second of the pair of first regions is doped with a second electric charge transport material different from the first electric charge transport material, wherein the third region and the fourth region are doped with the first electric charge transport material or the second electric charge transport material, and the third region is doped with a same electric charge transport material as the fourth region.

8. The display device according to claim 7, wherein the hole transport layer comprises a first host and a first dopant for an electron accepting material, and the electron transport layer comprises a second host and a second dopant for an electron donating material.

9. A display device comprising a first electrode, a hole transport layer, an emitting material layer, an electron transport layer, and a second electrode, which are stacked in sequence, wherein the emitting material layer comprises a plurality of sub-layers different in color of emitted light, and at least one of the sub-layers comprises a pair of first layers doped with an electric charge transport material by a first content and a second layer doped with an electric charge transport material by a second content lower than the first content, wherein the second layer is positioned between the pair of first layers, wherein at least another one of the sub-layers comprises:

a third layer doped with the electric charge transport material by a third content, wherein the third layer is positioned outside the first layer;

a fourth layer doped with the electric charge transport material by a fourth content lower than the third content and the first content, wherein the fourth layer is positioned outside the third layer, wherein the fourth layer is placed in an outmost part of the emitting material layer, wherein a first of the pair of first regions is doped with a first electric charge transport material and a second of the pair of first regions is doped with a second electric charge transport material different from the first electric charge transport material, wherein the third region and the fourth region are doped with the first electric charge transport material or the second electric charge transport material, and the third region is doped with a same electric charge transport material as the fourth region.

10. The display device according to claim 9, wherein the hole transport layer comprises a first host and a first dopant for an electron accepting material, and the electron transport layer comprises a second host and a second dopant for an electron donating material.

* * * * *